(12) United States Patent
Yang et al.

(10) Patent No.: US 9,444,250 B2
(45) Date of Patent: Sep. 13, 2016

(54) COMMON MODE FILTER

(71) Applicant: SAMSUNG ELECTRO-MECHANICS CO., LTD., Suwon (KR)

(72) Inventors: Ju Hwan Yang, Suwon (KR); Won Chul Sim, Sungnam (KR); Kwang Mo Kim, Seoul (KR); Jin Hyuck Yang, Suwon (KR); Hye Won Bang, Suwon (KR); Sung Kwon Wi, Seoul (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 524 days.

(21) Appl. No.: 14/062,310

(22) Filed: Oct. 24, 2013

(65) Prior Publication Data

US 2015/0029623 A1     Jan. 29, 2015

(30) Foreign Application Priority Data

Jul. 26, 2013 (KR) .................. 10-2013-0088881

(51) Int. Cl.
*H02H 9/04* (2006.01)
*H03H 7/38* (2006.01)
*H01G 4/06* (2006.01)
*H02H 7/20* (2006.01)

(52) U.S. Cl.
CPC ............... *H02H 9/046* (2013.01); *H01G 4/06* (2013.01); *H02H 9/045* (2013.01); *H03H 7/38* (2013.01); *H02H 7/20* (2013.01)

(58) Field of Classification Search
CPC ........ H02H 9/046; H02H 9/045; H02H 7/20; H03H 7/38; H01G 4/06
See application file for complete search history.

(56) References Cited

U.S. PATENT DOCUMENTS

| | | | | |
|---|---|---|---|---|
| 7,085,118 | B2 * | 8/2006 | Inoue ..................... | H01C 1/16 361/119 |
| 7,835,135 | B2 * | 11/2010 | Cho ....................... | H01G 4/40 361/301.4 |
| 8,199,451 | B2 * | 6/2012 | Asakura .................. | H01T 4/08 361/112 |
| 2007/0252659 | A1 * | 11/2007 | Suenaga ............. | H01F 17/0013 333/32 |

FOREIGN PATENT DOCUMENTS

KR     10-2010-0037000     4/2010

* cited by examiner

*Primary Examiner* — Zeev V Kitov
(74) *Attorney, Agent, or Firm* — McDermott Will & Emery LLP

(57) ABSTRACT

Disclosed herein is a common mode filter, including: first and second coil layers electromagnetically coupled to each other; a pair of external terminals connected to ends of the first coil layer and a pair of external terminals connected to ends of the second coil layer; a first ESD prevention member connecting between the pair of external terminals carrying electric current with the first coil layer and a second ESD prevention member connecting between the pair of external terminals carrying electric current with the second coil layer; and a ground electrode connecting the first ESD prevention member to the second ESD prevention member, wherein the ground electrode has a stepped portion formed at the center.

10 Claims, 4 Drawing Sheets

COMMON MODE FILTER

CROSS REFERENCE(S) TO RELATED APPLICATIONS

This application claims the benefit under 35 U.S.C. Section 119 of Korean Patent Application Serial No. 10-2013-0088881, entitled "Common Mode Filter" filed on Jul. 26, 2013, which is hereby incorporated by reference in its entirety into this application.

BACKGROUND OF THE INVENTION

1. Technical Field

The present invention relates to a common mode filter, and more particularly, to a common mode filter having an ESD protection capability.

2. Description of the Related Art

As technologies evolve, electronic devices such as a mobile phone, a home appliance, a personal computer (PC), a personal digital assistant (PDA), a liquid crystal display (LCD), and the like, are being changed from an analog manner into a digital manner, and data processing speed is being increased as the amount of processing data increases. Accordingly, high-speed signal transmission interfaces such as a USB 2.0 interface, a USB 3.0 interface, and a high-definition multimedia interface (HDMI) are widely employed. Such interfaces are currently used in many digital devices such as personal computers and digital high quality televisions.

Unlike single-end transmission systems which have been used for ages, theses high-speed interfaces employ a differential signal system which uses a pair of signal lines to transmit differential signals (differential mode signals). However, digitalized, high-speed electronic devices are sensitive to the environments so that signal distortion due to high-frequency noise often occurs.

In order to remove such noise, filters are installed in electronic devices, and especially common mode filters are being widely used to remove common mode noise in high-speed differential signal lines. The common mode noise refers to the noise occurring in differential signal lines, and the common mode filters remove the common mode noise which was not removed by existing filters.

Recently, since high-speed, digital interfaces process minute signals at high transmission rate, very sensitive IC should be used for electro static discharge (ESD) generated when different devices are connected to and separated from each other.

In this regard, Patent Document (Korean Patent Laid-Open Publication No. 10-2010-0037000) proposes a common mode filter having an ESD protection layer. As shown in FIG. 3 of the Patent Document, the ESD protection layer 12b is further provided under the common mode filter layers 12a, and the ESD protection layer includes the ESD absorption layer 30 to function as an ESD protection material. With this configuration, an overvoltage signal due to static electricity exits through gap electrodes 28 and 29 which maintains a predetermined gap with lead conductors, and thereby protecting spiral conductors 17 and 18 in the common mode filter layer.

In the common mode filter disclosed in the Patent Document, however, it is difficult to implement a thinned chip since the separate ESD protection layer for ESD protection is provided in the common mode filter. Moreover, the lead conductor maintaining a predetermined gap with the gap electrodes 28 and 29 is connected to one terminal, i.e., an input terminal of the pair of external terminals (e.g., 13a and 13b) with respect to e.g., one spiral conductor 17, ESD protection is not possible when an overvoltage signal is applied to the other terminal of the external terminals, i.e., an output terminal.

PRIOR ART DOCUMENT

Patent Document (Patent Document 1) Korean Patent Laid-Open Publication No. 10-2010-0037000

SUMMARY OF THE INVENTION

An object of the present invention is to provide a common mode filter which can easily implement a thin chip by way of providing a bar-shaped ESD protection member in a coil layer, specifically between a via electrode and an external terminal.

Another object of the present invention is to provide a common mode filter which can protect a coil layer from an overvoltage applied either of input/output terminals by way of connecting an ESD protection member to both ends of the coil layer.

According to an exemplary embodiment of the present invention, there is provided a common mode filter, including: first and second coil layers electromagnetically coupled to each other; a pair of external terminals connected to ends of the first coil layer and a pair of external terminals connected to ends of the second coil layer; a first ESD prevention member connecting between the pair of external terminals carrying electric current with the first coil layer and a second ESD prevention member connecting between the pair of external terminals carrying electric current with the second coil layer; and a ground electrode connecting the first ESD prevention member to the second ESD prevention member, wherein the ground electrode has a stepped portion formed at the center.

The first ESD prevention member and the second ESD prevention member may have a bar shape.

The ground electrode may have a bar shape having a stepped portion at the center.

The common mode filter may further include a magnetic resin compound around the ground electrode including a depressed space formed by the stepped portion in the ground electrode.

According to an exemplary embodiment of the present invention, there is provided a common mode filter, including: a magnetic substrate; an insulating layer on which the magnetic substrate is provided and in which first and second coil layers electromagnetically coupled to each other are disposed; a pair of external terminals provided on the insulating layer and connected to ends of the first coil layer through a via electrode, and a pair of external terminals provided on the insulating layer and connected to ends of the second coil layer through a via electrode; a first ESD prevention member connecting between the pair of external terminals carrying electric current with the first coil layer and a second ESD prevention member connecting between the pair of external terminals carrying electric current with the second coil layer; and a ground electrode provided on the insulating layer and connecting the first ESD prevention member to the second ESD prevention member, wherein the ground electrode has a stepped portion formed at the center.

The first ESD prevention member and the second ESD prevention member may be disposed in parallel, and the ground electrode may traverse between the first ESD prevention member and the second ESD prevention member.

The first ESD prevention member and the second ESD prevention member may be provided between the via electrodes and the external terminals.

The common mode filter may further include a magnetic resin compound located around the ground electrode including a depressed space formed by the stepped portion in the ground electrode and the external terminals.

The magnetic resin compound may have the same height with the ground electrode and the external terminals.

The stepped portion in the ground electrode may be formed at a position corresponding to a center core portion of the first and second coil layers.

DESCRIPTION OF THE PREFERRED EMBODIMENTS

Various advantages and features of the present invention and methods for achieving the same will become apparent from the following description of exemplary embodiments with reference to the accompanying drawings. However, the present invention may be modified in many different ways and it should not be limited to exemplary embodiments set forth herein. These exemplary embodiments may be provided so that this disclosure will be thorough and complete, and will fully convey the scope of the invention to those skilled in the art.

Terms used in the specification are not for limiting the present invention but for illustrating exemplary embodiments. Unless explicitly described to the contrary, a singular form includes a plural form in the specification. The components, steps, operations and/or elements stated herein do not exclude the existence or addition of one or more other components, steps, operations and/or elements.

Hereinafter, configurations and effects of exemplary embodiments of the present invention will be described in more detail with reference to the accompanying drawings.

Figure 1:
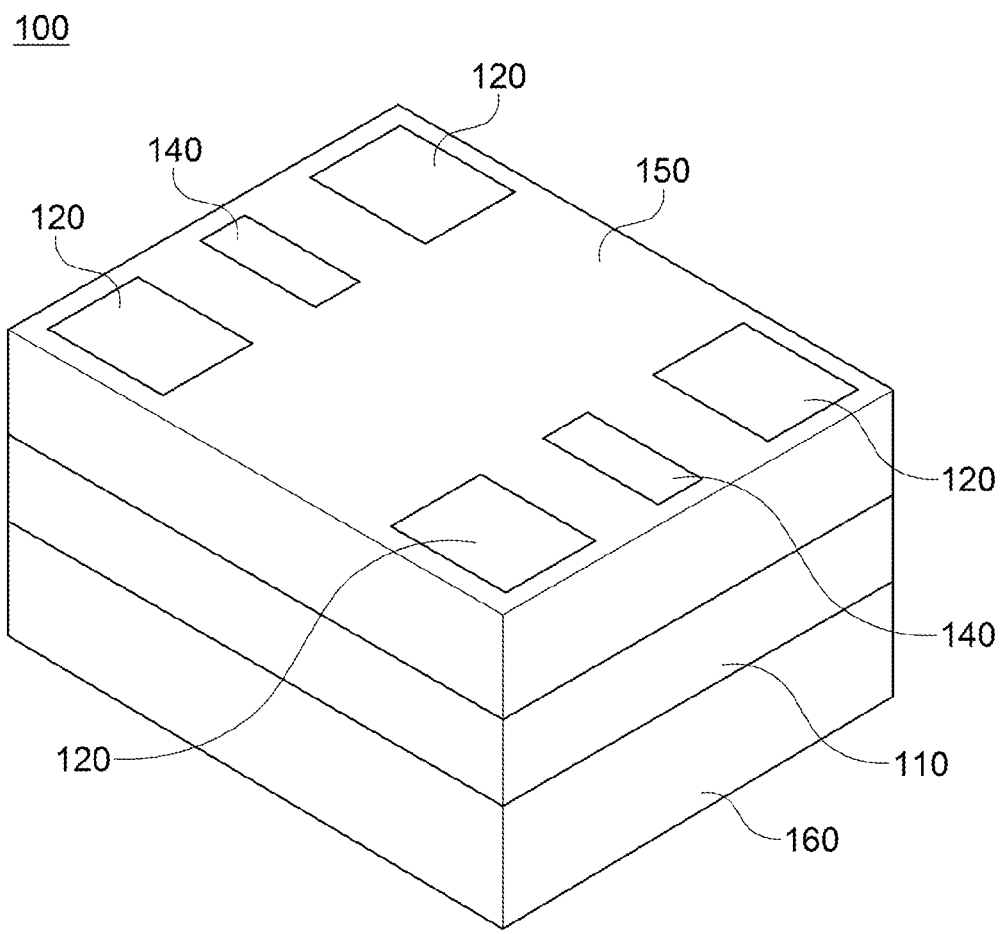
FIG. 1 is a perspective view of a common mode filter according to an exemplary embodiment of the present invention.
Figure 2:
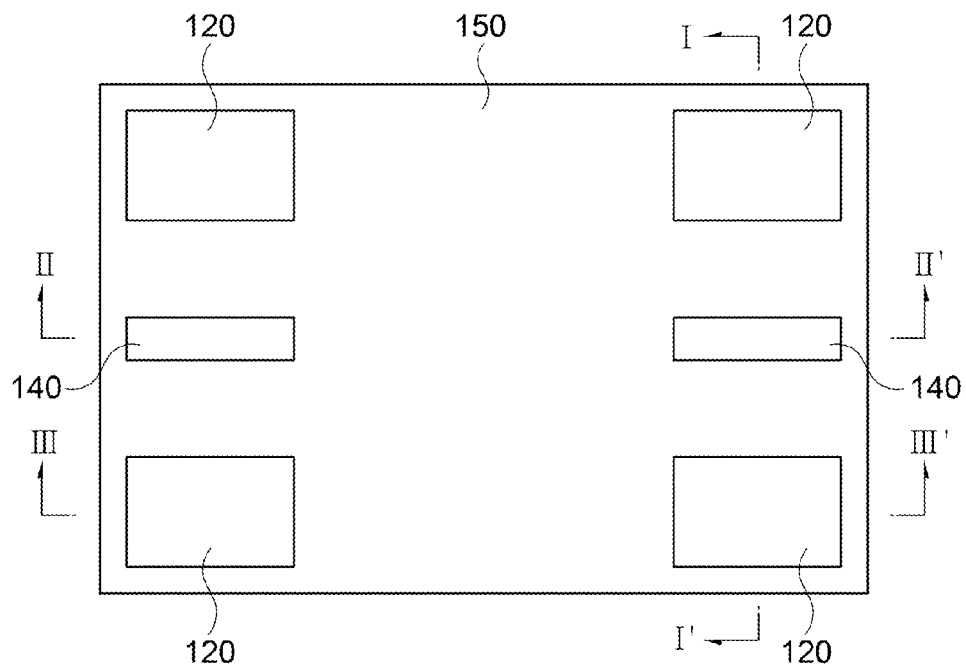
FIG. 2 is a plan view of a common mode filter according to an exemplary embodiment of the present invention.
Figure 3:
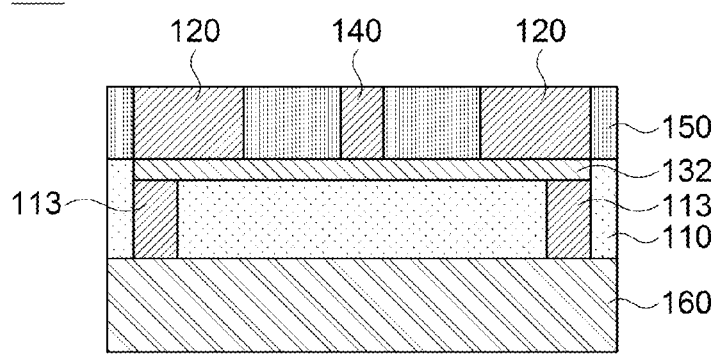
FIG. 3 is a cross-sectional view taken along line I-I' of FIG. 2.
Figure 4:
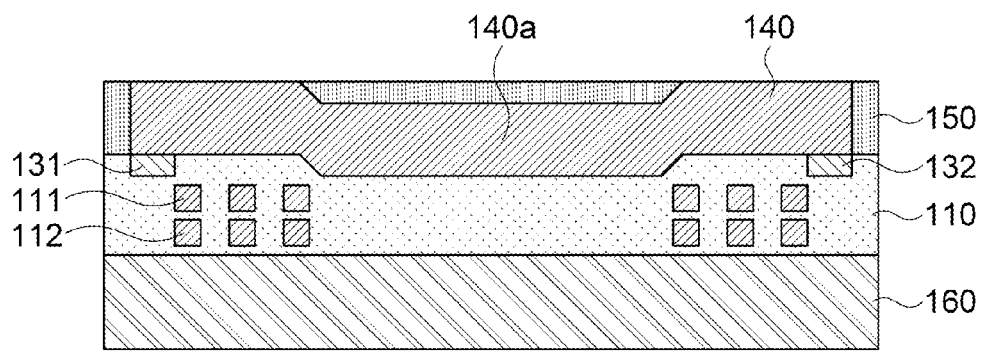
FIG. 4 is a cross-sectional view taken along line II-II' of FIG. 2.
Figure 5:
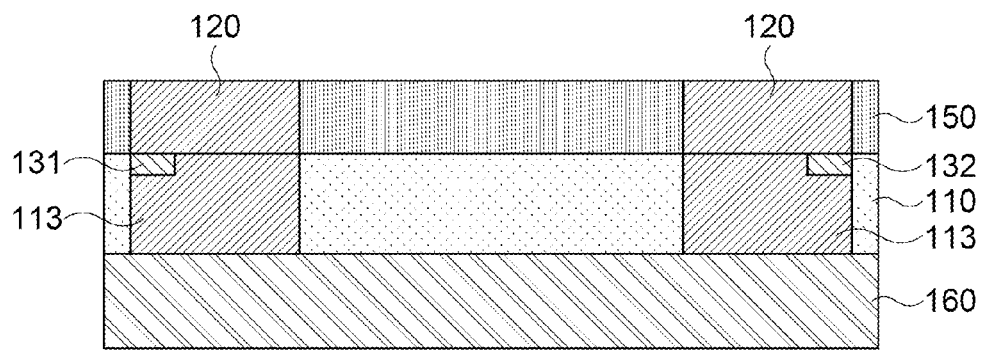
FIG. 5 is a cross-sectional view taken along line III-III' of FIG. 2.

FIG. 1 is a perspective view of a common mode filter according to an exemplary embodiment of the present invention, FIG. 2 is a plan view of a common mode filter according to an exemplary embodiment of the present invention, FIG. 3 is a cross-sectional view taken along line I-I' of FIG. 2, FIG. 4 is a cross-sectional view taken along line II-II' of FIG. 2, and FIG. 5 is a cross-sectional view taken along line III-III' of FIG. 2.

Additionally, components shown in the accompanying drawings are not necessarily shown to scale. For example, sizes of some components shown in the accompanying drawings may be exaggerated as compared with other components in order to facilitate the understanding of the exemplary embodiments of the present invention. Throughout the accompanying drawings, the same reference numerals will be used to denote the same components. For simplification and clearness of illustration, a general configuration scheme will be shown in the accompanying drawings, and detailed descriptions on features and technologies well known in the art will be omitted in order not to obscure exemplary embodiments of the present invention unnecessarily.

Referring to FIGS. 1 to 5, a common mode filter 100 according to an exemplary embodiment of the present invention mainly includes a primary coil layer 111, a secondary coil layer 112, an external terminal 120, a first ESD prevention member 131, a second ESD prevention member 132, and a ground electrode 140.

The first and second coil layers 111 and 112 are spiral metal lines plated as a coil pattern, and may be formed of at least one material selected from a group consisting of silver (Ag), palladium (Pd), aluminum (Al), nickel (Ni), titanium (Ti), gold (Au), copper (Cu), and platinum (Pt), which have excellent conductivity, or a mixture of at least two material.

In the drawings, the first and second coil layers 111 and 112 are stacked in the thickness direction facing one another, with a predetermined gap. However, the first and second coil layers 111 and 112 may be disposed on the same plane such that the patterns are disposed alternately or may have two or more layers to increase turn numbers of the coils.

The first and second coil layers 111 and 112 receive external signal via external terminals 120 connected to both ends. That is, the first coil layer 111 has a pair of external terminals 120 connected to its ends to carry electric current to the outside, and the second coil layer 112 has a pair of external terminals 120 connected to its ends to carry electric current to the outside. For one of the coil layers, one of the external terminals 120 connected to one end may be an input terminal and, the other of the external terminals 120 connected to the other end may be an output terminal.

The first and second coil layers 111 and 112, which receive external signals via the external terminals 120 and are disposed adjacent to each other, form electromagnetic coupling with each other. Accordingly, if current flows in the same direction in the first and second coil layers 111 and 112, magnetic flux is enhanced so that common mode impedance is increased to suppress common mode noise. If current flows in opposite directions in the first and second coil layers 111 and 112, magnetic flux is attenuated so that differential mode impedance is decreased to function as a common mode filter that transmits a desired transmission signal.

The first and second coil layers 111 and 112 may be disposed in an insulating layer 110, and the external terminals 120 may be formed on the insulating layer 110 to be electrically connected to the first and second coil layers 111 and 112 through via electrodes 113 penetrating the insulating layer 110.

The insulating layer 110 provides electric insulation to the first and second coil layers 111 and 112 and protects the first and second coil layers 111 and 112 from the external environment. Therefore, it is preferable to select the material of the insulating layer 110 in the light of an insulation property, a heat-resisting property, a moisture-resisting property and the like. For example, most preferably, the polymer material of the insulation layer 110 may include a thermosetting resin such as an epoxy resin, a phenol resin, a urethane resin, a silicon resin, a polyimide resin, or the like, and a thermoplastic resin such as a polycarbonate resin, an acrylic resin, a polyacetal resin, a polypropylene resin, or the like.

The insulating layer 110 having the first and second coil layers 111 and 112 disposed therein may be formed on a magnetic substrate 160.

The magnetic substrate 160 has a hexahedron shape formed of a ferrite material sized to fit the width and length of a chip, and is disposed bottom of the chip to support various types of features as well as the insulation layer 110. Specifically, the magnetic substrate 160 may be composed of Fe—Ni—Zn oxide, Fe—Ni—Zn—Cu oxide, or metal based ferrite such as Fe, Ni, Fe—Ni (Permalloy). Accordingly, it may function as a path for magnetic flux generated in the first and second coil layers 111 and 112, together with a magnetic resin compound 150.

Figure 6:
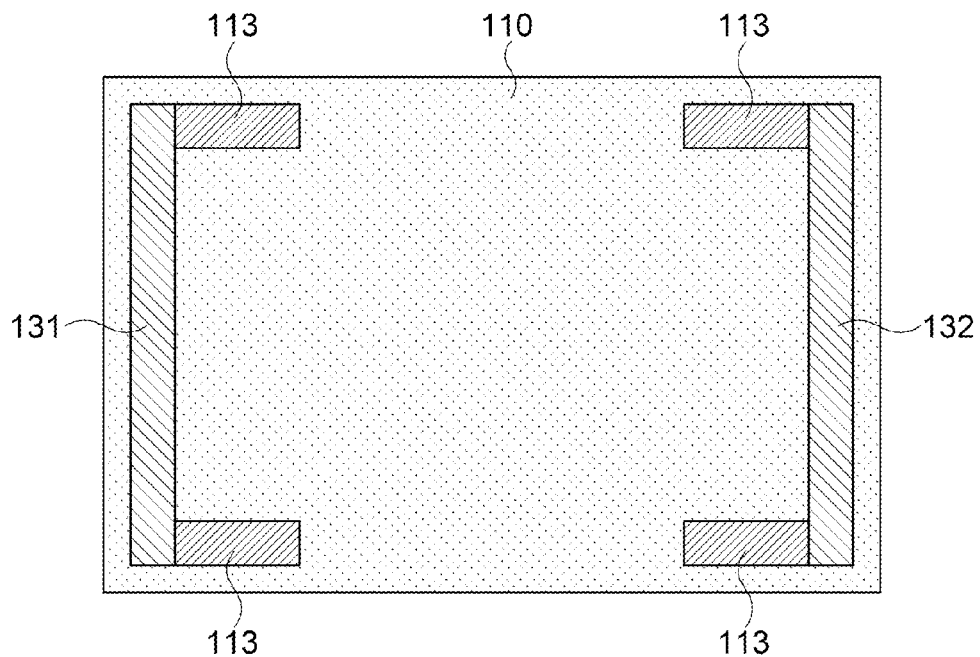
FIG. 6 is a top view of a common mode filter according to an exemplary embodiment of the present invention before external terminals are formed.

The first and second ESD prevention members 131 and 132 may connect between external terminals 120 each carrying electric current to the respective one of the first and second coil layers 111 and 112. That is, as shown in FIG. 6 which shows a top view of a common mode filter before the external terminals 120 are formed, the first ESD prevention member 131 may have a bar shape to connect a pair of external terminals 120 which carries electric current to the first coil layer 111 to each other in a straight line. Further, the second ESD prevention member 132 may also have a bar shape to connect a pair of external terminals 120 which carries electric current to the second coil layer 112 to each other in a straight line.

Here, the first and second ESD prevention members 131 and 132 may be made of insulating resin matrix in which various types of metal particles are dispersed. Examples of the resin material used as the matrix may include a polymer material such as an epoxy resin, a phenol resin, a urethane resin, a silicon resin and a polyimide resin. The metal particles may be at least one selected from a group consisting of C, Ni, Cu, Au, Ti, Cr, Ag, Pd and Pt, or a metal alloy thereof.

The first and second ESD prevention members 131 and 132 thus configured have infinite resistance values, so that signals applied from the external terminals 120 flow through the first and second coil layers 111 and 112. On the other hand, an overvoltage due to static electricity is applied, an electron tunneling phenomenon occurs, i.e., conductive paths are made among the metal particles in the first and second ESD prevention members 131 and 132. As a result, an overvoltage signal passes through the first and second ESD prevention members 131 and 132 and exits through a ground electrode 140 connected to the first and second ESD prevention members 131 and 132.

In particular, in the embodiment, since each of the first and second ESD prevention members 131 and 132 connects the respective pairs of external terminals 120 to each other, each of the pairs being connected to the ends of the respective coil layers 111 and 112, an overvoltage signal may exit regardless of directivity, whether the overvoltage signal is applied through the external terminals 120 as an input terminal or an output terminal.

The first and second ESD prevention members 131 and 132 may be provided between the respective via electrodes 113 and the respective external terminals 120. Specifically, each of the via electrodes 113 has a groove at its upper edge to receive one of the first and second ESD prevention members 131 and 132. The first and second ESD prevention members 131 and 132 are inserted into the grooves such that their side surfaces are embedded in the insulating layer 110 and their upper surfaces are exposed to the outside so as to make contact with the external terminals 120. The bar-shaped, first and second ESD prevention members 131 and 132 do not occupy any layer but are disposed in the insulating layer 120, such that the common mode filter according to the embodiment of the present invention is advantageous in that it is thin and small.

Figure 7:
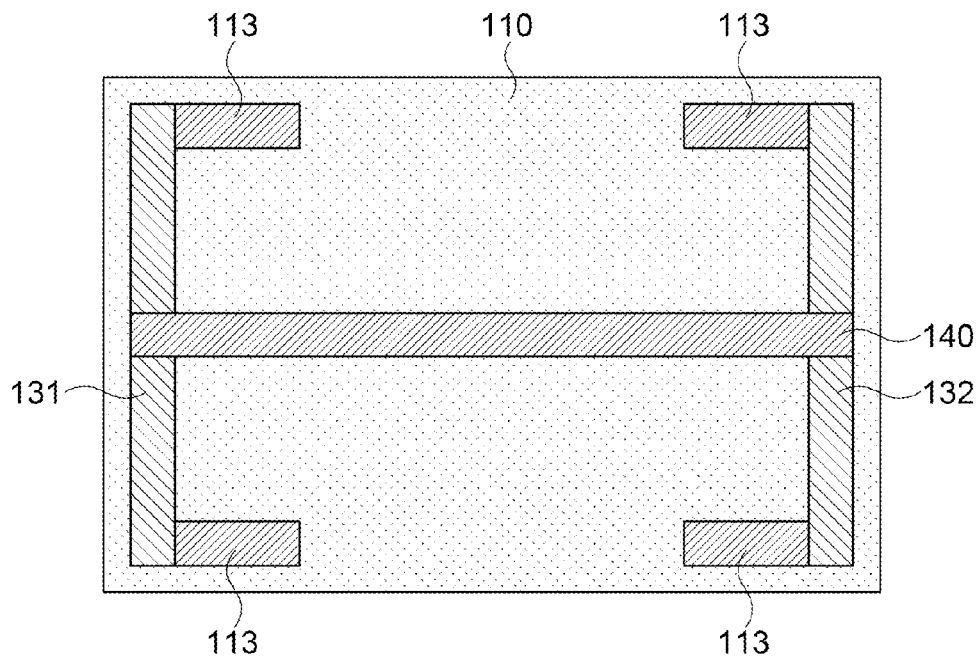
FIG. 7 shows a top view of a common mode filter according to an exemplary embodiment of the present invention before a magnetic resin compound is formed.

The ground electrodes 140 may be provided to connect the first and second ESD prevention members 131 and 132 with each other. That is, as shown in FIG. 7 which shows a top view of the common mode filter before the magnetic resin compound 150 is formed, the first ESD prevention member 131 and the second ESD prevention member 132 may be disposed in parallel, and the ground electrode 140 may have a bar shape to connect between the first and second ESD prevention members 131 and 132 like a bridge.

By doing so, an overvoltage signal flowing in any of the first and second ESD prevention members 131 and 132 may exit through the ground electrodes 140 connected to the other ESD prevention member, and thus the embodiment is advantageous to signal flow.

In addition, a stepped portion 140a may be formed at the center of the ground electrode 140. The magnetic resin compound 150 composed of ferrite and a resin is provided around the external terminals 120 and the ground electrode 140, thereby facilitating flow of the magnetic flux generated in the first and second coil layers 111 and 112. In an embodiment, the magnetic resin compound 150 may fill a recessed space formed by the stepped portion 140a in the ground electrode 140 and accordingly the magnetic flux may flow more smoothly.

Here, the stepped portion 140a in the ground electrode 140 may be formed a position corresponding to center core portions of the first and second coil layers 111 and 112. That is, since the center core portions of the first and second coil layers 111 and 112 are filled with the resin material of the insulating layer 110, the stepped portion 140a in the ground electrode 140 may be depressed in the center core portion such that it does not make contact with the first and second coil layers 111 and 112.

The higher the stepped portion 140a is, the wider the depression space by the stepped portion 140 is, so that more magnetic resin compound 150 may fill it. However, since it is difficult to manufacture such a ground electrode 140 in terms of processing, and a short-circuit to the ground electrode 140 is more likely to be made, it is desired to set the height of the stepped portion 140a appropriately taking into account the above concerns.

The ground electrodes 140 and the external terminals 120 may have the same thickness, and the magnetic resin compound 150 may also have the same thickness with the ground electrodes 140 and the external terminals 120. Therefore, the other portions than the stepped portion 140a on the upper surface of the external terminals 120 and the ground electrodes 140 are exposed to the outside of the chip, so that the exposed surface may be in contact with one surface of the substrate when it is mounted on the substrate.

As set forth above, according to the embodiments of the present invention, a chip can be thinned more easily, and a coil layer can be protected from an overvoltage applied from either of input/output external terminals.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the scope of concept of the invention disclosed in the specification, the scope equivalent to the disclosure and/or the scope of the technology or knowledge in the art to which the present invention pertains. The exemplary embodiments described above have been provided to explain the best mode in carrying out the present invention. Therefore, they may be carried out in other modes known to those skilled in the art in using other inventions such as the present invention and also be modified in various forms required in specific application fields and usages of the invention. Therefore, it is to be understood that the invention is not limited to the disclosed embodiments. Further, it is to be understood that other embodiments also fall within the spirit and scope of the appended claims.

What is claimed is:

1. A common mode filter, comprising:
   first and second coil layers electromagnetically coupled to each other;
   a pair of external terminals connected to ends of the first coil layer and a pair of external terminals connected to ends of the second coil layer;
   a first ESD prevention member connecting between the pair of external terminals carrying electric current with the first coil layer and a second ESD prevention member connecting between the pair of external terminals carrying electric current with the second coil layer; and
   a ground electrode connecting the first ESD prevention member to the second ESD prevention member,
   wherein the ground electrode has a stepped portion formed at the center.

2. The common mode filter according to claim 1, wherein the first ESD prevention member and the second ESD prevention member have a bar shape.

3. The common mode filter according to claim 1, wherein the ground electrode has a bar shape having a stepped portion at the center.

4. The common mode filter according to claim 1, further comprising a magnetic resin compound located around the ground electrode including a depressed space formed by the stepped portion in the ground electrode.

5. A common mode filter, comprising:
   a magnetic substrate;
   an insulating layer on which the magnetic substrate is provided and in which first and second coil layers electromagnetically coupled to each other are disposed;
   a pair of external terminals provided on the insulating layer and connected to ends of the first coil layer through a via electrode, and a pair of external terminals provided on the insulating layer and connected to ends of the second coil layer through a via electrode;
   a first ESD prevention member connecting between the pair of external terminals carrying electric current with the first coil layer and a second ESD prevention member connecting between the pair of external terminals carrying electric current with the second coil layer; and
   a ground electrode provided on the insulating layer and connecting the first ESD prevention member to the second ESD prevention member, wherein the ground electrode has a stepped portion formed at the center.

6. The common mode filter according to claim 5, wherein the first ESD prevention member and the second ESD prevention member are disposed in parallel, and the ground electrode traverses between the first ESD prevention member and the second ESD prevention member.

7. The common mode filter according to claim 5, wherein the first ESD prevention member and the second ESD prevention member are provided between the via electrodes and the external terminals.

8. The common mode filter according to claim 5, further comprising a magnetic resin compound located around the ground electrode including a depressed space formed by the stepped portion in the ground electrode and the external terminals.

9. The common mode filter according to claim 8, wherein the magnetic resin compound has the same height with the ground electrode and the external terminals.

10. The common mode filter according to claim 5, wherein the stepped portion in the ground electrode is formed at a position corresponding to a center core portion of the first and second coil layers.

* * * * *